United States Patent
Abe

(10) Patent No.: US 7,948,813 B2
(45) Date of Patent: May 24, 2011

(54) NON-VOLATILE SEMICONDUCTOR MEMORY DEVICE AND ITS READING METHOD

(75) Inventor: Keiko Abe, Yokohama (JP)

(73) Assignee: Kabushiki Kaisha Toshiba, Tokyo (JP)

(*) Notice: Subject to any disclaimer, the term of this patent is extended or adjusted under 35 U.S.C. 154(b) by 122 days.

(21) Appl. No.: 12/406,498

(22) Filed: Mar. 18, 2009

(65) Prior Publication Data

US 2010/0080054 A1 Apr. 1, 2010

(30) Foreign Application Priority Data

Sep. 26, 2008 (JP) ................................. 2008-248954

(51) Int. Cl.
*G11C 7/00* (2006.01)
*G11C 7/22* (2006.01)

(52) U.S. Cl. .................... 365/189.16; 365/171; 365/158; 365/148; 365/189.15; 365/189.07; 365/189.09

(58) Field of Classification Search ............. 365/189.16, 365/171, 158, 163, 189.07, 207, 148, 189.15, 365/189.09
See application file for complete search history.

(56) References Cited

U.S. PATENT DOCUMENTS 6,317,376 B1 11/2001 Tran et al.
6,842,366 B2 1/2005 Tanizaki et al.

*Primary Examiner* — Hoai V Ho
*Assistant Examiner* — Kretelia Graham
(74) *Attorney, Agent, or Firm* — Oblon, Spivak, McClelland, Maier & Neustadt, L.L.P.

(57) ABSTRACT

A reading method includes: selecting the memory cell; performing a read operation on the selected memory cell to supply the read voltage, amplifying a first voltage read out from the selected memory element, outputting a second voltage obtained by amplifying the first voltage, and storing the second voltage as a first read state; performing a write operation on the selected memory cell to supply one of the first and second write voltages, regarding a third voltage appearing on the second line during the write operation as a second read state, comparing the first read state with the second read state, and deciding a state stored in the memory element before the read operation, as a read logic state on the basis of a result of the comparison; and writing the decided read logic state into the memory element if a logic state written in the write operation is different from the decided read logic state.

11 Claims, 17 Drawing Sheets

NON-VOLATILE SEMICONDUCTOR MEMORY DEVICE AND ITS READING METHOD

CROSS-REFERENCE TO RELATED APPLICATION

This application is based upon and claims the benefit of priority from prior Japanese Patent Application No. 2008-248954 filed on Sep. 26, 2008 in Japan, the entire contents of which are incorporated herein by reference.

BACKGROUND OF THE INVENTION

1. Field of the Invention

The present invention relates to a non-volatile semiconductor memory device and its reading method.

2. Related Art

The magnetoresistive random access memory (hereafter referred to as MRAM as well) formed of memory cells each having a magnetic tunnel junction (hereafter referred to as MTJ as well) has excellent features such as non-volatility, infinite rewriting withstand property and fast operation. Therefore, application thereof as a universal memory is expected. Since variation among memory cells is large, it is difficult to make the capacity large.

In the MRAM, variation of the resistance value among cells caused by the shape of the MTJ is large, and distribution of low resistance values and distribution of high resistance values overlap sometimes. If in this case the method of using a reference resistance value which is provided between the average value of the high resistance values and the average value of the low resistance values and which is common to a plurality of cells as a reference and comparing a resistance value read out with the reference resistance value is used, then read errors are generated.

As a method for reading states in cells varied in resistance value without using the reference resistance value in order to solve the problem, a method called self reference reading is disclosed in U.S. Pat. No. 6,317,376. In the self reference read method, a value read out first is compared with a value read out after writing is performed and a decision is made whether the resistance of the cell has changed. A series of read operations in the self reference read method includes a first step of reading of a selected memory cell, a second step of the writing logic "0" and then reading, a third step of the writing logic "1" and then reading, a fourth step of deciding the read out logic state on the basis of results of the first to third steps, and a fifth step of writing back the decided logic state. There is a problem that the read access time is long. By the way, the decision of the read out logic state is performed by generating a reference voltage from read out voltages of the logic "0" and the logic "1" obtained at the second and third steps and comparing the reference voltage with a voltage obtained by the reading at the first step.

As an example of solving the problem of the long read access time, a circuit which shortens the read access time by executing reading consecutively after writing predetermined state is disclosed in U.S. Pat. No. 6,842,366. In this circuit as well, however, a procedure for performing switch to the read operation after write operation of predetermined state is necessary. The problem of the long read access time remains.

SUMMARY OF THE INVENTION

The present invention has been made in view of these circumstances, and an object of thereof is to provide a non-volatile semiconductor memory device which is short in read access time as far as possible and its reading method.

According to a first aspect of the present invention there is provided a non-volatile semiconductor memory device including: at least one memory cell each having a non-volatile memory element; a first line to which a first end of the memory element is connected; a second line to which a second end of the memory element is connected; a first write circuit which includes a first transistor, the first transistor supplying a first write voltage to the first line; a second write circuit which includes a second transistor, the second transistor supplying a second write voltage to the second line; a third write circuit which includes a third transistor and which is controlled so as to be paired with the first write circuit in write operation, the third transistor supplying a third write voltage to the second line; a fourth write circuit which includes a fourth transistor and which is controlled so as to be paired with the second write circuit in write operation, the fourth transistor supplying a fourth write voltage to the first line; a read circuit which includes a fifth transistor and which is controlled so as to be paired with the fourth write circuit in read operation, the fifth transistor supplying a read voltage to the second line; an amplifier circuit which amplifies a first voltage read out from the memory element onto the second line by the read operation for supplying the read voltage to the second line by the fifth transistor and outputs a second voltage obtained by amplifying the first voltage; a comparator circuit which includes a retaining part to retain the second voltage, and which compares a third voltage appearing on the second line during the write operation with the second voltage retained by the retaining part; and a read logic state output circuit which outputs logic state corresponding to state stored in the memory element before the read operation, as a read logic state on the basis of a result of the comparison performed by the comparator circuit.

According to a second aspect of the present invention there is provided a reading method for a non-volatile semiconductor memory device including: at least one memory cell each having a non-volatile memory element; a first line to which a first end of the memory element is connected; a second line to which a second end of the memory element is connected; a first write circuit which includes a first transistor, the first transistor supplying a first write voltage to the first line; a second write circuit which includes a second transistor, the second transistor supplying a second write voltage to the second line; a third write circuit which includes a third transistor and which is controlled so as to be paired with the first write circuit in write operation, the third transistor supplying a third write voltage to the second line; a fourth write circuit which includes a fourth transistor and which is controlled so as to be paired with the second write circuit in write operation, the fourth transistor supplying a fourth write voltage to the first line; and a read circuit which includes a fifth transistor and which is controlled so as to be paired with the fourth write circuit in read operation, the fifth transistor supplying a read voltage to the second line, the method comprising: selecting the memory cell; performing a read operation on the selected memory cell to supply the read voltage to the second line by the fifth transistor, amplifying a first voltage read out from the selected memory element onto the second line, outputting a second voltage obtained by amplifying the first voltage, and storing the second voltage as a first read state of the memory element; thereafter performing a write operation on the selected memory cell to supply one of the first write voltage and the second write voltage to one of the first and second lines by the first or second transistor, regarding a third voltage appearing on the second line during the write operation as a second read state of the memory element, comparing the first read state with the second read state, and deciding a state stored in the memory element before the read operation, as a read logic state on the basis of a result of the comparison; and writing the decided read logic state into the memory element if a logic state written in the write operation is different from the decided read logic state.

DETAILED DESCRIPTION OF THE INVENTION

Hereafter, embodiments of the present invention will be described with reference to the drawings.

First Embodiment

A non-volatile semiconductor memory device according to a first embodiment of the present invention will now be described with reference to FIGS. 1 to 8.

Figure 1:
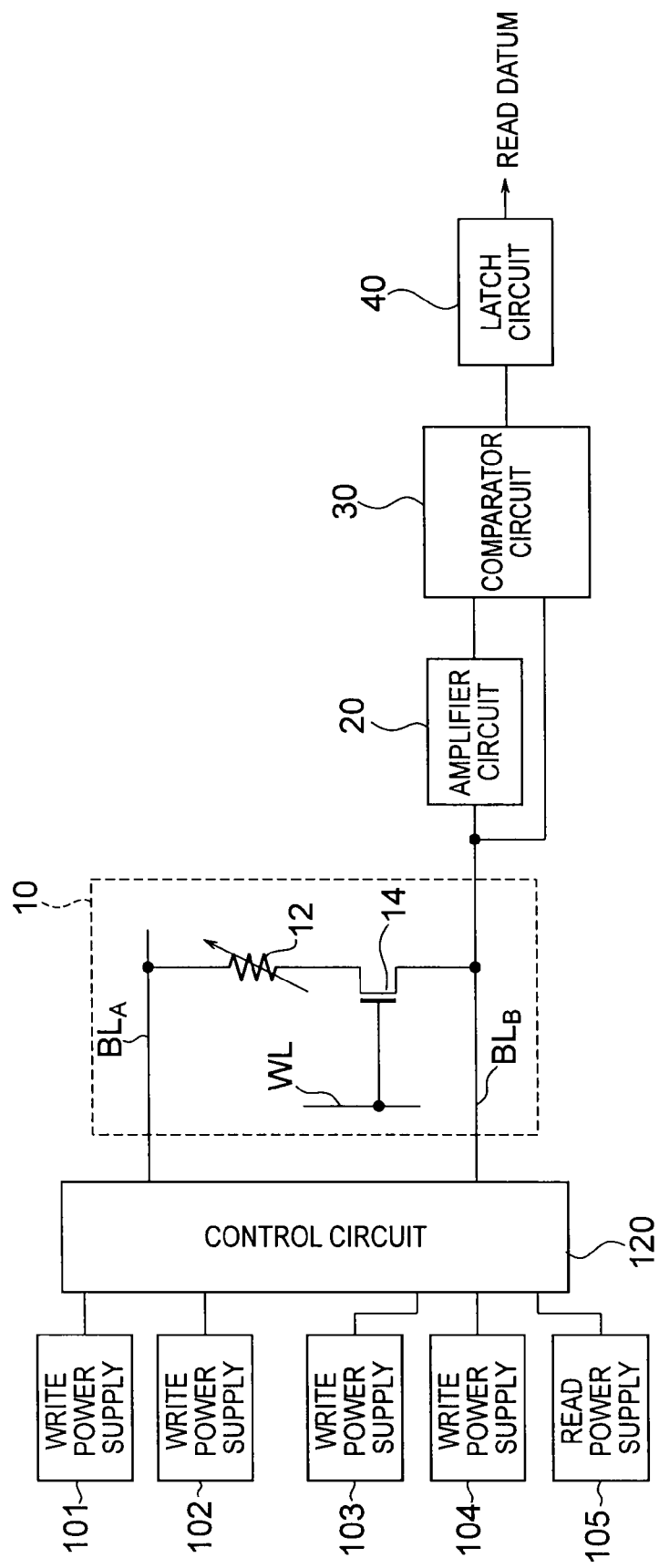
FIG. 1 is a block diagram showing a non-volatile semiconductor memory device according to a first embodiment.

The non-volatile semiconductor memory device according to the present embodiment is shown in FIG. 1. The non-volatile semiconductor memory device according to the present embodiment is an MRAM which includes at least one memory cell 10, an amplifier circuit 20, a comparator circuit 30, a latch circuit (read logic state output circuit) 40, write power supply circuits 101 to 104, a read power supply circuit 105, and a control circuit 120.

Figure 5:
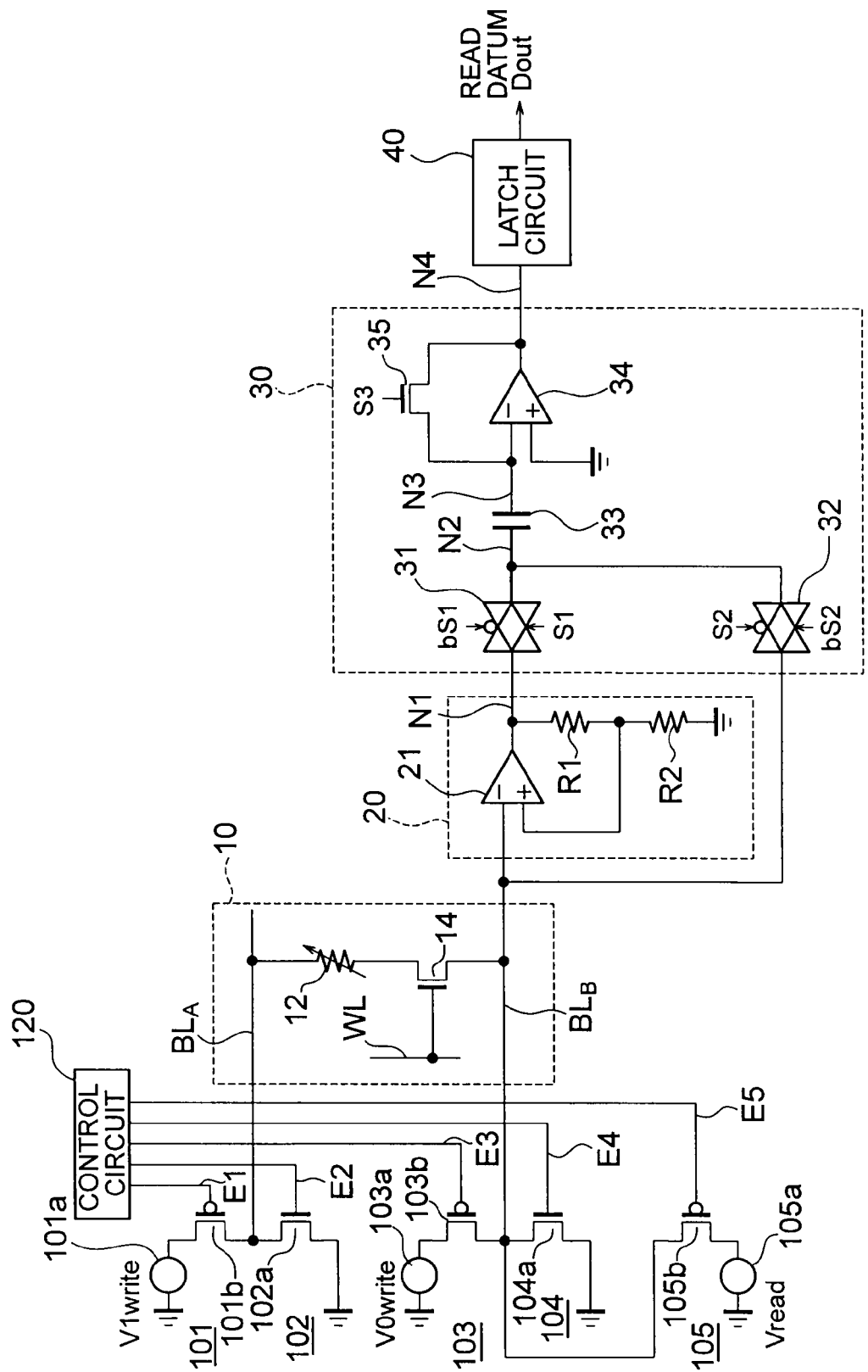
FIG. 5 is a circuit diagram showing a concrete example of the non-volatile semiconductor memory device according to the first embodiment.

The memory cell 10 includes a MTJ device (MTJ element) 12 serving as a memory element having an MTJ and a selection transistor 14 connected in series with the MTJ device 12. A first end of a series circuit composed of the MTJ device 12 and the selection transistor 14 connected to a bit line $BL_A$, and a second end of the series circuit is connected to a bit line $BL_B$. The selection transistor 14 is connected at its gate to a word line WL. In other words, a first end of the MTJ device 12 is connected to the bit line $BL_A$, whereas a second end of the MTJ device 12 is connected to a first end of the selection transistor 14, and a second end of the selection transistor 14 is connected to the bit line $BL_B$ as shown in FIG. 5. Unlike the configuration shown in FIG. 5, in an alternative configuration, the first end of the selection transistor 14 may be connected to the bit line $BL_A$, whereas the second end of the selection transistor 14 may be connected to the first end of the MTJ device 12, and the second end of the MTJ device 12 may be connected to the bit line $BL_B$.

Figure 2:
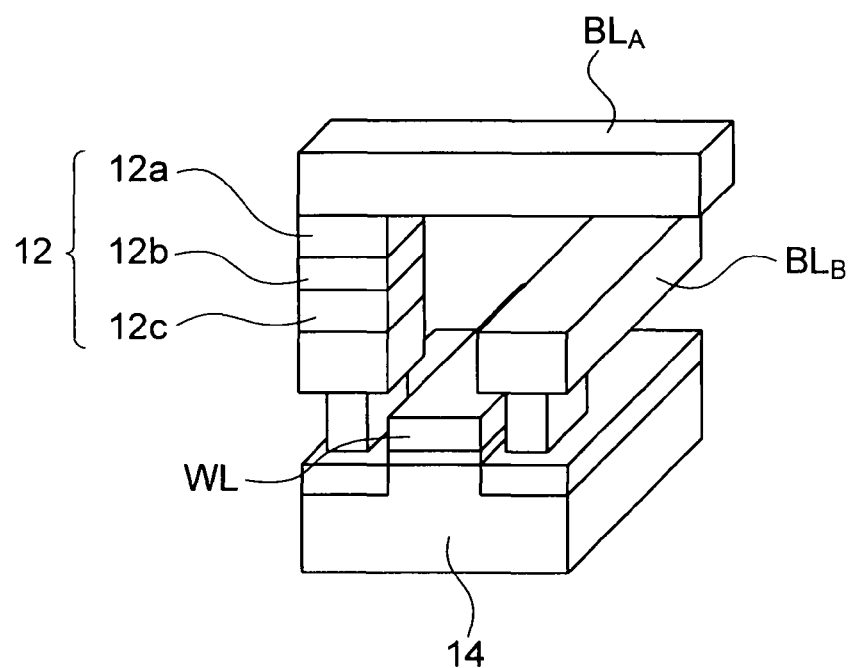
FIG. 2 is a perspective view showing a memory cell according to the first embodiment.
Figure 3:
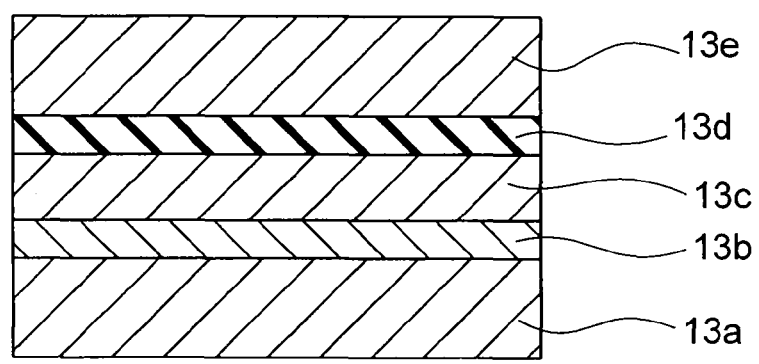
FIG. 3 is a sectional view showing another configuration of a MTJ device (MTJ element)
Figure 4:
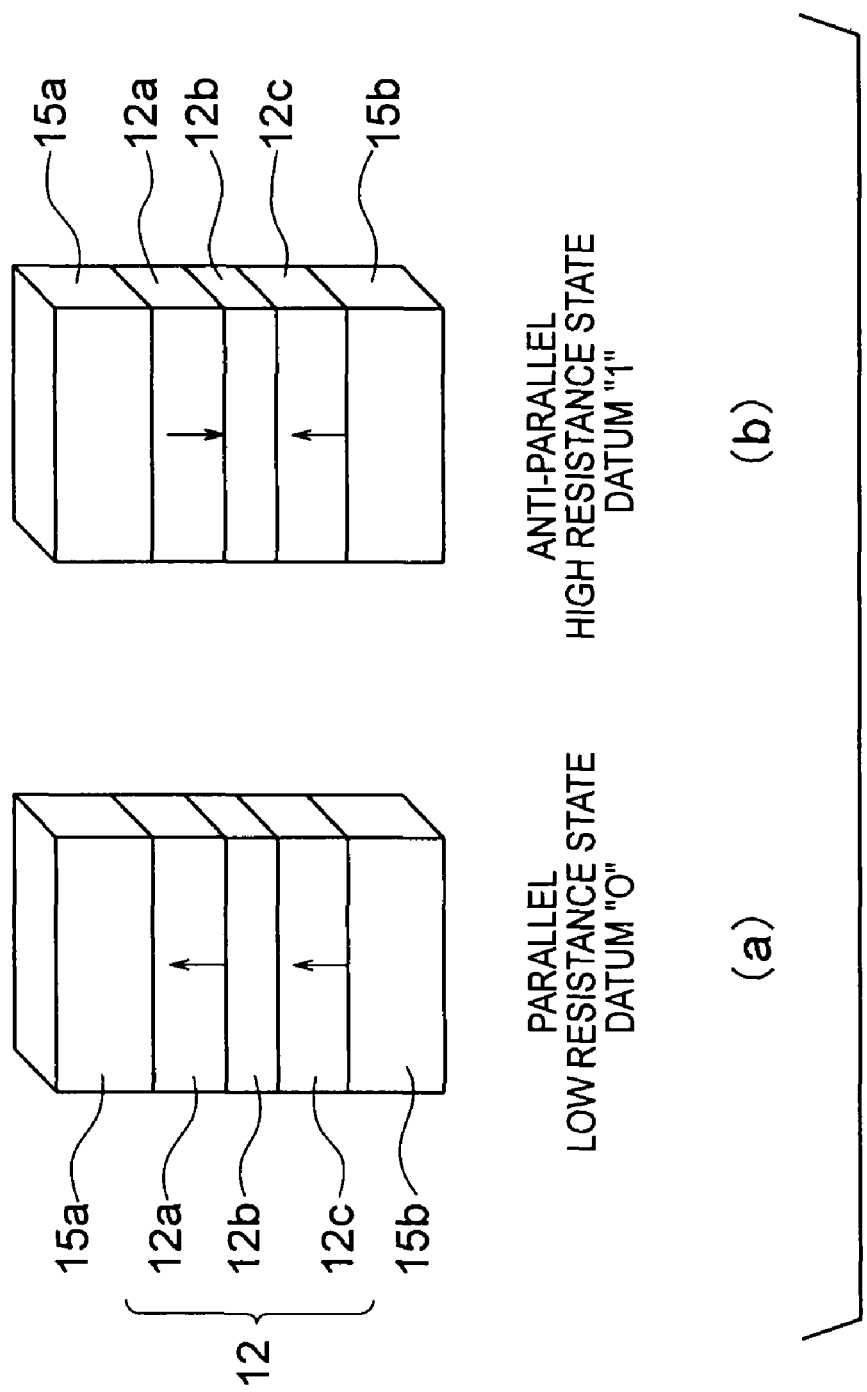
FIGS. 4(a) and (b) are diagrams for explaining recording states of the MTJ device.

A perspective view of the memory cell 10 is shown in FIG. 2. As shown in FIG. 2, the MTJ device 12 includes a free layer 12a which is variable in magnetization direction, a barrier layer 12b, and a fixed layer 12c fixed in magnetization direction. The magnetization of the free layer 12a is reversed and the resistance value of the MTJ device 12 is changed by injecting a spin-polarized current. In the free layer 12a and the fixed layer 12c in the present embodiment, the magnetization direction is nearly perpendicular to the film face, i.e., the easy magnetization axis direction is nearly perpendicular to the film face. Alternatively, the magnetization direction may be nearly parallel to the film face, i.e., the easy magnetization axis direction may be nearly parallel to the film face. Furthermore, the stack order of the free layer 12a, the barrier layer 12b and the fixed layer 12c may be reversed. And a first electrode (15a in FIGS. 4(a) and 4(b)) may be provided between the free layer 12a and the bit line $BL_A$, and a second electrode (15b in FIGS. 4(a) and 4(b)) may be provided between the fixed layer 12c and the bit line $BL_B$. As shown in FIG. 2, the MTJ device 12 in the present embodiment has a three-layer stacked structure composed of the free layer 12a, the barrier layer 12b and the fixed layer 12c. Alternatively, as shown in FIG. 3, a MTJ device 13 called dual junction and formed by stacking a fixed layer 13a, a spacer layer (nonmagnetic layer) 13b, a free layer 13c, a barrier layer 13d and a reference layer 13e may be used. In this case as well, each of the fixed layer 13a, the free layer 13b and the reference layer 13e has an easy magnetization axis which is nearly perpendicular to the film face.

In the spin injection type MTJ device 12, write operation is performed according to the direction of a current let flow. Writing into the MTJ device 12 is performed by turning on the selection transistor 14 with the word line WL and applying a write voltage Vwrite or a write current Iwrite between the bit line $BL_A$ and the bit line $BL_B$ so as to apply a write signal to the MTJ device 12.

FIGS. 4(a) and 4(b) show stored states of the spin injection type MTJ device 12. If spin directions of the free layer 12a and the fixed layer 12c are parallel, then the resistance value of the MTJ device 12 is low (see FIG. 4(a)). On the contrary, if spin directions are opposite to each other (anti-parallel), then the resistance value of the MTJ device is high (see FIG. 4(b)). Hereafter, the present embodiment will be described supposing that the low resistance value corresponds to a logic "0" and the high resistance value corresponds to a logic "1" in order to simplify the description. Alternatively, it is possible that the low resistance value corresponds to the logic "1" and the high resistance value corresponds to the logic "0."

A concrete circuit configuration of an MRAM in the present embodiment is shown in FIG. 5. The write power supply circuit 101 includes a power supply 101a which generates a write voltage V1write to the write logic "1", and a p channel MOSFET 101b which is connected at its source to the power supply 101a and connected at its drain to the bit line $BL_A$, and which receives at its gate a control signal E1 from the control circuit 120. The write voltage V1write is output to the bit line $BL_A$ by turning on the p channel MOSFET 101b.

A write power supply circuit 102 includes an n channel MOSFET 102a which is connected at its drain to the bit line $BL_A$ and connected at its source to the ground and which receives at its gate a control signal E2 from the control circuit 120. A write voltage GND (=0 V) is output to the bit line $BL_A$ by turning on the n channel MOSFET 102a.

A write power supply circuit 103 includes a power supply 103a which generates a write voltage V0write to the write logic "0", and a p channel MOSFET 103b which is connected at its source to the power supply 103a and connected at its drain to the bit line $BL_B$, and which receives at its gate a control signal E3 from the control circuit 120. The write voltage V0write is output to the bit line $BL_B$ by turning on the p channel MOSFET 103b.

A write power supply circuit 104 includes an n channel MOSFET 104a which is connected at its drain to the bit line $BL_B$ and connected at its source to the ground and which receives at its gate a control signal E4 from the control circuit 120. A write voltage GND is output to the bit line $BL_B$ by turning on the n channel MOSFET 104a.

A write power supply circuit 105 includes a power supply 105a which generates a read voltage Vread, and a p channel MOSFET 105b which is connected at its source to the power supply 105a and connected at its drain to the bit line $BL_B$, and which receives at its gate a control signal E5 from the control circuit 120. The write voltage Vread is output to the bit line $BL_B$ by turning on the p channel MOSFET 105b. As for writing into the memory cell 10, write power supply circuits are selected so as to output a combination of the write voltage V1write and GND when the writing logic "1" and output a combination of the write voltage V0write and GND when the writing logic "0." Write operation is performed so as to let flow currents which are opposite to each other in direction through the MTJ device 12 in the memory cell 10. As for the read operation, for example, the read voltage Vread and GND which causes the direction of the current flowing through the MTJ device 12 to become the "0" write direction are selected so as to avoid a disturbance to the MTJ device 12.

For example, as shown in FIG. 5, the amplifier circuit 20 includes an operational amplifier 21 and resistor elements R1 and R2 connected in series. The amplifier circuit 20 functions as an amplifier circuit having an amplification factor of n. An output terminal of the operational amplifier 21 is connected to a node N1. A first end of a series circuit composed of the resistor elements R1 and R2 is connected to the node N1, and a second end of the series circuit is connected to ground. An inverting input terminal of the operational amplifier 21 is connected to the bit line $BL_B$, and a non-inverting input terminal of the operational amplifier 21 is connected to a shared connection node between the resistor element R1 and the resistor element R2. For example, when fabricating an amplifier circuit having an amplification factor n=2.9 with a 0.25 μm CMOS process as the amplifier circuit 20, it is supposed that the operational amplifier 21 is a basic differential amplifier and the voltage at the non-inverting input terminal is 0.7 V. Then a power supply voltage of a p channel MOS transistor included in the differential amplifier is set equal to 2.5 V. A power supply voltage of an n channel MOS transistor included in the differential amplifier is set equal to 0 V. As for the size of the p channel MOS transistor and the n channel MOS transistor, the channel length is set equal to 0.24 μm and the channel width W is set equal to 5 μm. The resistance value of the resistor element R1 is set equal to 20 kΩ, and the resistance value of the resistor element R2 is set equal to 5 kΩ.

For example, as shown in FIG. 5, the comparator circuit 30 includes transfer gates 31 and 32, a capacitor 33, an operational amplifier 34, and an n channel MOS transistor 35. A first end of the transfer gate 31 is connected to the node N1, and a second end of the transfer gate 31 is connected to a node N2. The transfer gate 31 is operated according to a control signal S1 sent from the control circuit 120 and its inverted control signal bS1. The transfer gate 32 is operated according to a control signal S2 sent from the control circuit 120 and its inverted control signal bS2. A first end of the capacitor 33 is connected to the node N2, and a second end of the capacitor 33 is connected to a node N3. An inversion input terminal of the operational amplifier 34 is connected to the node N3, and a non-inverting input terminal of the operational amplifier 34 is connected to the ground. An output of the operational amplifier 34 is fed back to the non-inverting input terminal of the operational amplifier 34 via the n channel MOS transistor 35. A control signal S3 from the control circuit 120 is applied to the MOS transistor 35 at its gate, and the MOS transistor 35 is operated according to the control signal S3.

The latch circuit (read logic state output circuit) 40 latches the output of the operational amplifier 34 and outputs it as a read logic state.

Figure 6:
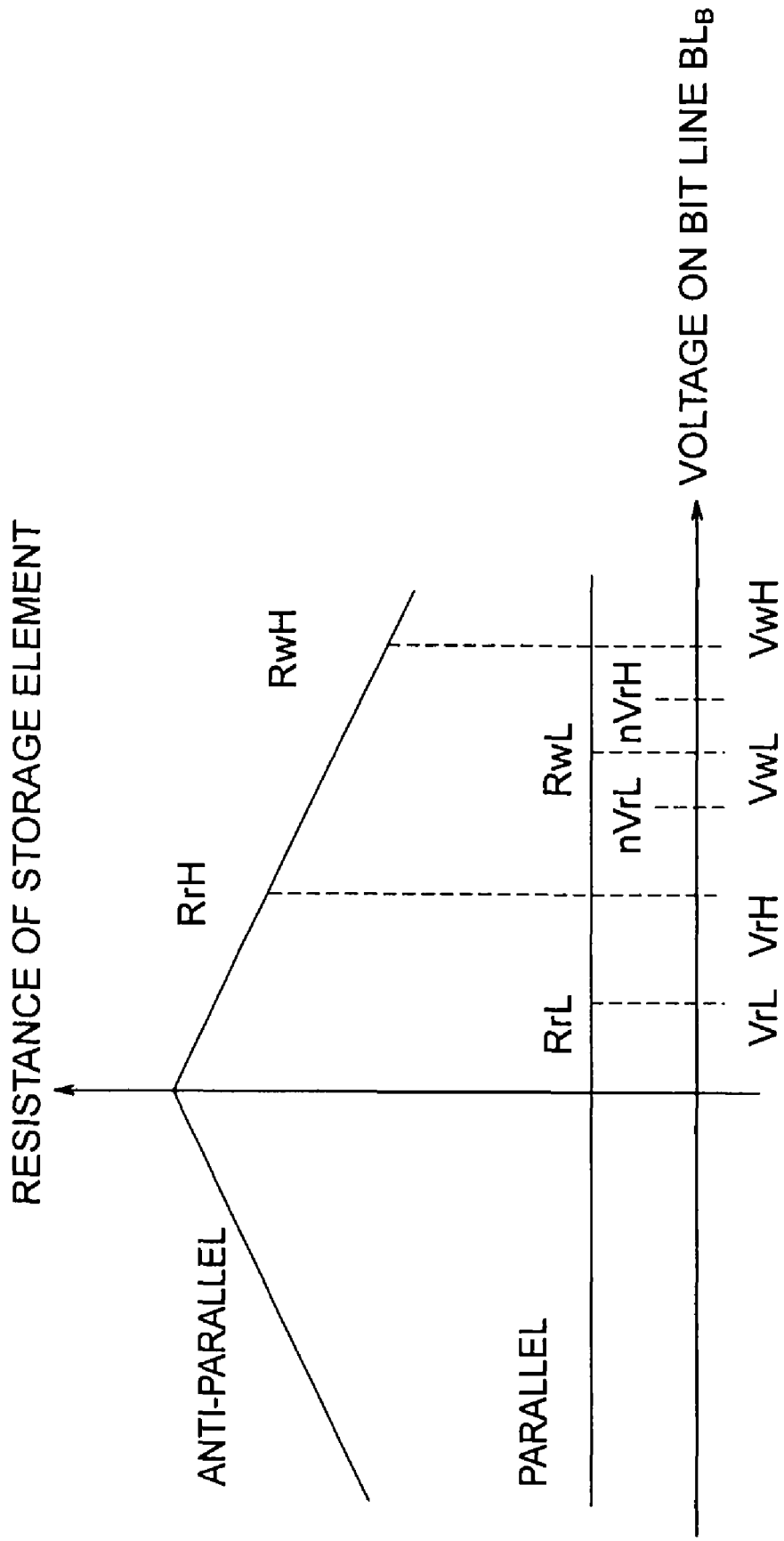
FIG. 6 is a diagram showing voltage-resistance characteristics of the MTJ device.

In the present embodiment, the resistance value of the MTJ device (memory element) 12 changes with changes in the voltage as disclosed in, for example, a document "S. Ikegawa et. Al., Journal of Applied Physics 101, 09B504 (2007)." FIG. 6 shows relations between a voltage on the bit line $BL_B$ and the resistance value of the memory element 12. A voltage Vr obtained on the bit line $BL_B$ when the read voltage Vread is selected becomes Vr=VrH if the memory element 12 is high in resistance, and becomes Vr=VrL if the memory element 12 is low in resistance. A voltage V0w obtained on the bit line $BL_B$ when the write voltage V0write of the write logic "0" is selected becomes VwH if the memory element 12 is high in resistance, and becomes VwL if the memory element 12 is low in resistance. Relations in magnitude among them become VrL<VrH<VwL<VwH. Concrete values of them can be obtained by measuring characteristics of a test cell fabricated under the same conditions as those of the memory cell 10 shown in FIG. 5.

Although a reading method for the MRAM in the present embodiment will be described later, first reading is performed first. In the first reading, the voltage Vr appearing on the bit line $BL_B$ when the read voltage Vread is selected is increased to n times by the amplifier circuit 20 and the resultant value nVr is retained by the capacitor 33 in the comparator circuit 30. Subsequently, second reading is performed. In the second reading, the voltage V0w appearing on the bit line $BL_B$ when the write voltage Vwrite is selected is compared with the value nVr and a decision is made whether nVr is equal to or less than V0w or nVr is greater than V0w to decide a read state. For making a decision on the read state, therefore, it is desirable to set the amplification factor n of the amplifier circuit 20 in the following range.

$$VwL/VrH < n < VwL/VrL$$

Figure 7:
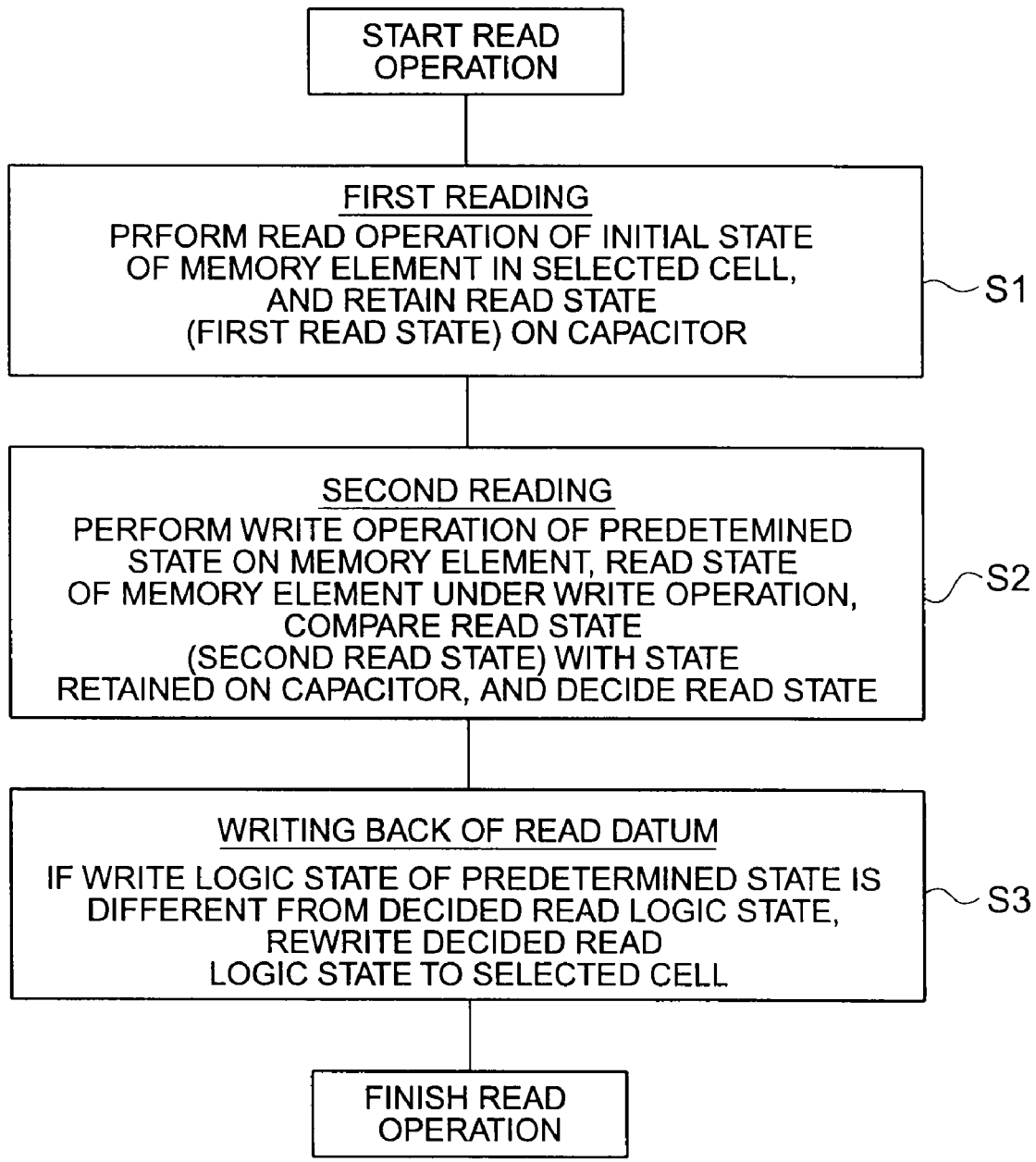
FIG. 7 is a flow chart for explaining a reading method for the non-volatile semiconductor memory device according to the first embodiment.
Figure 8:
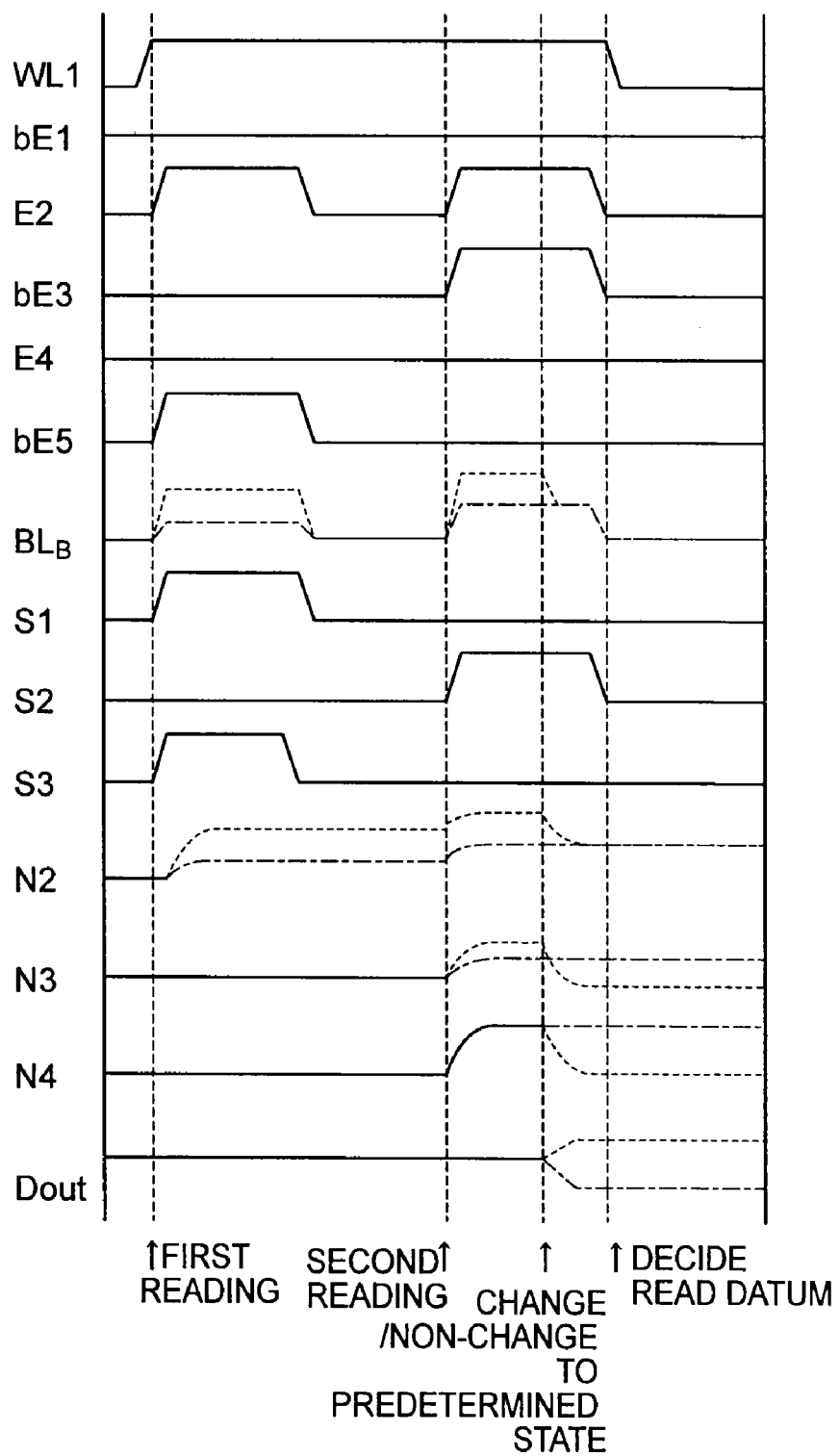
FIG. 8 is a timing chart for explaining the reading method for the non-volatile semiconductor memory device according to the first embodiment.

The read operation for the MRAM in the present embodiment having the above-described configuration will now be described with reference to FIG. 7 and FIG. 8. A flow chart of the read operation for the MRAM in the present embodiment is shown in FIG. 7. A timing waveform diagram of the first reading and the second reading in the read operation is shown in FIG. 8. The read operation for the MRAM in the present embodiment is formed of three stages. First, selection of a memory cell 10 from which a state should be read is performed. This selection is performed by the control circuit 120 which selects a word line WL and bit lines $BL_A$ and $BL_B$.

1) First, as a first stage, first reading is performed on the selected memory cell 10 (see step S1 in FIG. 7). In the first reading, a read operation of an initial state of the memory element 12 in the selected memory cell 10 is performed. In the initial state reading, the selection transistor 14 is turned on by causing the voltage on the word line WL to be "H." Subsequently, the control circuit 120 causes the control signal E5 to be "L," i.e., causes its inverted control signal bE5 (see FIG. 8) to be "H" and causes the control signal E2 to be "H." Thereby the MOS transistor 105b and the MOS transistor 102a are turned on. In other words, the read voltage Vread and GND are selected and the voltage on the bit line $BL_B$ becomes Vr. When the memory element 12 is in the high resistance state, it follows that Vr=VrH. When the memory element 12 is in the low resistance state, it follows that Vr=VrL. Concurrently with application of the read voltage, the transfer gate 31 and the MOS transistor 35 in the comparator circuit 30 are turned on (the signals S1 and S3 are H) and the transfer gate 32 is turned off (the signal S2 is L). As a result, the capacitor 33 is charged with a voltage which is n times as high as VrH or VrL. The voltage at the node N2 becomes nVrH or nVrL, and the voltage at the node N3 becomes 0 V. In addition, the MOS transistor 35 is turned off and subsequently the transfer gate 31 is turned off. Thus the first reading is finished. As a result, the first read state read out is retained on the capacitor 33 in the comparator circuit 30.

2) Subsequently, as a second stage, second read operation is performed (see step S2 in FIG. 7). In the second reading, a write operation of a predetermined state is performed on the memory element 12 in the selected memory cell 10, state of the memory element 12 under the write operation is read, and the state thus read (second read state) is compared with state stored on the capacitor 33 to decide the read state. It is supposed in the present embodiment that the write operation of the predetermined state on the memory element 12 is, for example, write operation of the logic "0." The present embodiment has a feature that the read operation is performed concurrently when writing the logic "0." Such a reading method is made possible because writing and reading are performed by using the same line $BL_B$.

First, the control circuit 120 causes the control signal E3 to be "L," i.e., causes its inverted control signal bE3 to be "H" and causes the control signal E2 to be "H." Thereby the MOS transistor 103b and the MOS transistor 102a are turned on. In other words, the write voltage of the logic "0" V0write and GND are selected and the voltage on the bit line $BL_B$ becomes VwH when the memory element 12 is in the high resistance state, and becomes VwL when the memory element 12 is in the low resistance state. Concurrently with application of the write voltage, the transfer gate 32 in the comparator circuit 30 is turned on (the signal S2 is H). As a result, the voltage on the bit line $BL_B$ is applied as it is to the node N2 (the signals S1 and S3 are L).

If the state of the memory element 12 before the logic "0" is written, i.e., the initial state of the memory element 12 is "0," the voltage at the node N3 becomes VwL−nVrL. Since VwL−nVrL>0, a signal of "H" level is output to the node N4.

On the other hand, if the initial state of the memory element 12 is "1," the voltage at the node N3 becomes VwL−nVrH. Since VwL−nVrH<0, a signal of "L" level is output to the node N4.

The state output to the node N4 is latched by the latch circuit 40. Supposing that read logic state Dout is output from an inverted output terminal of the latch circuit 40, Dout=0 is output if the initial state of the memory element 12 is "0" and Dout=1 is output if the initial state is "1."

3) Finally, as a third stage, writing back of the read logic state is performed. The control circuit 120 makes a decision for the selected memory cell 10 whether the write logic state of the predetermined state in the second stage and the read logic state decided in the second stage are different from each other. If they are different from each other, the control circuit 120 rewrites the decided read logic state (see step S3 in FIG. 7). If the second reading is performed and the voltage at the node N4 becomes the "L" level, a state "0" different from the initial state "1" has already been written into the selected memory cell 10. If the read logic state is decided to be "1," the control circuit 120 causes the control signal E1 to be "L," i.e., causes its inverted control signal bE1 to be "H" and causes the control signal E4 to be "H." Thereby the MOS transistor 101b and the MOS transistor 104a are turned on. In other words, the write voltage of the logic "1" V1write and GND are selected, and the logic "1" is rewritten into the memory element 12. A series of read operations are completed as heretofore described.

According to the present embodiment, read operation is performed during the write operation in the self reference scheme as heretofore described. As compared with the case where the read operation is performed after the write operation as in the conventional case, the read access time can be shortened.

Second Embodiment

Figure 9:
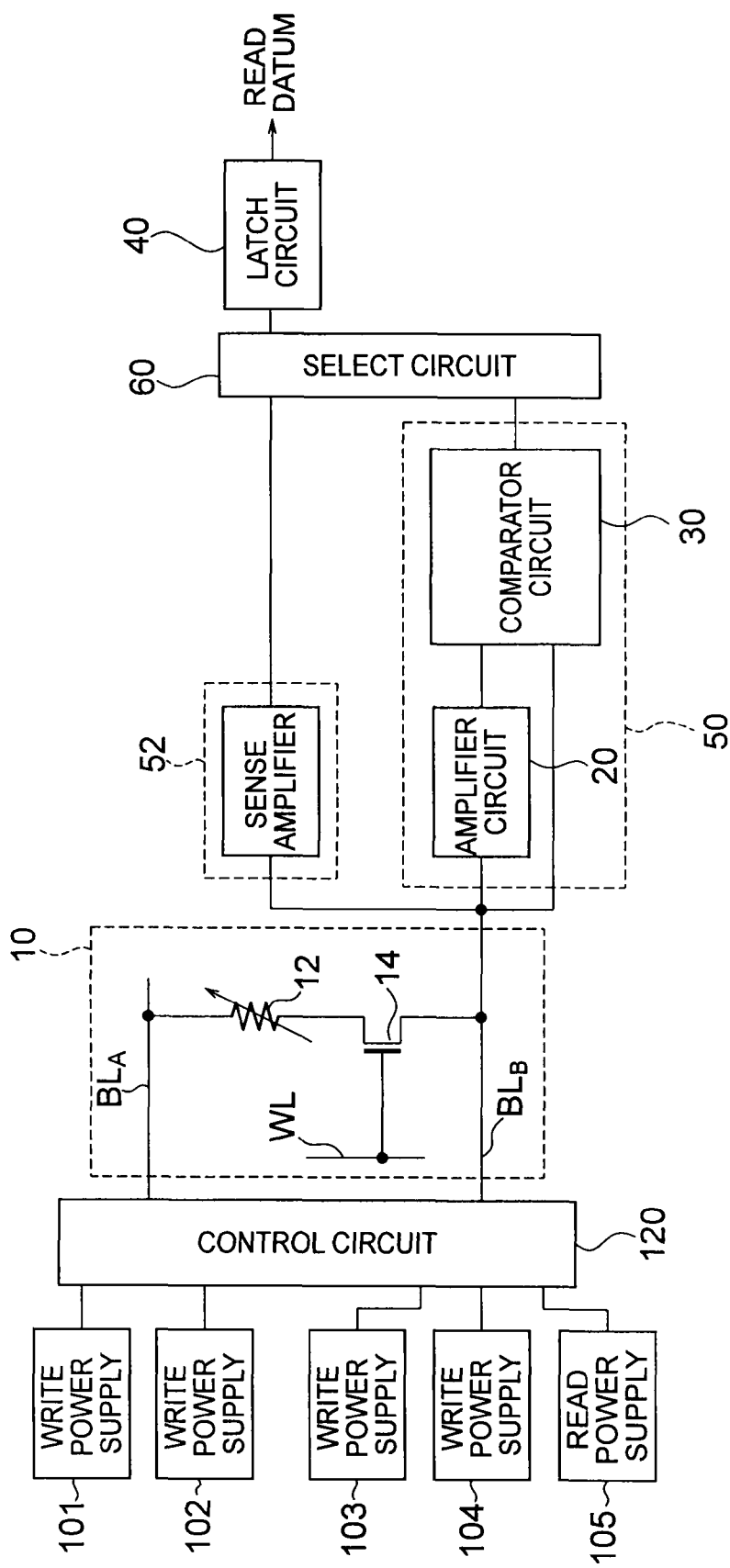
FIG. 9 is a block diagram showing a non-volatile semiconductor memory device according to a second embodiment.
Figure 10:
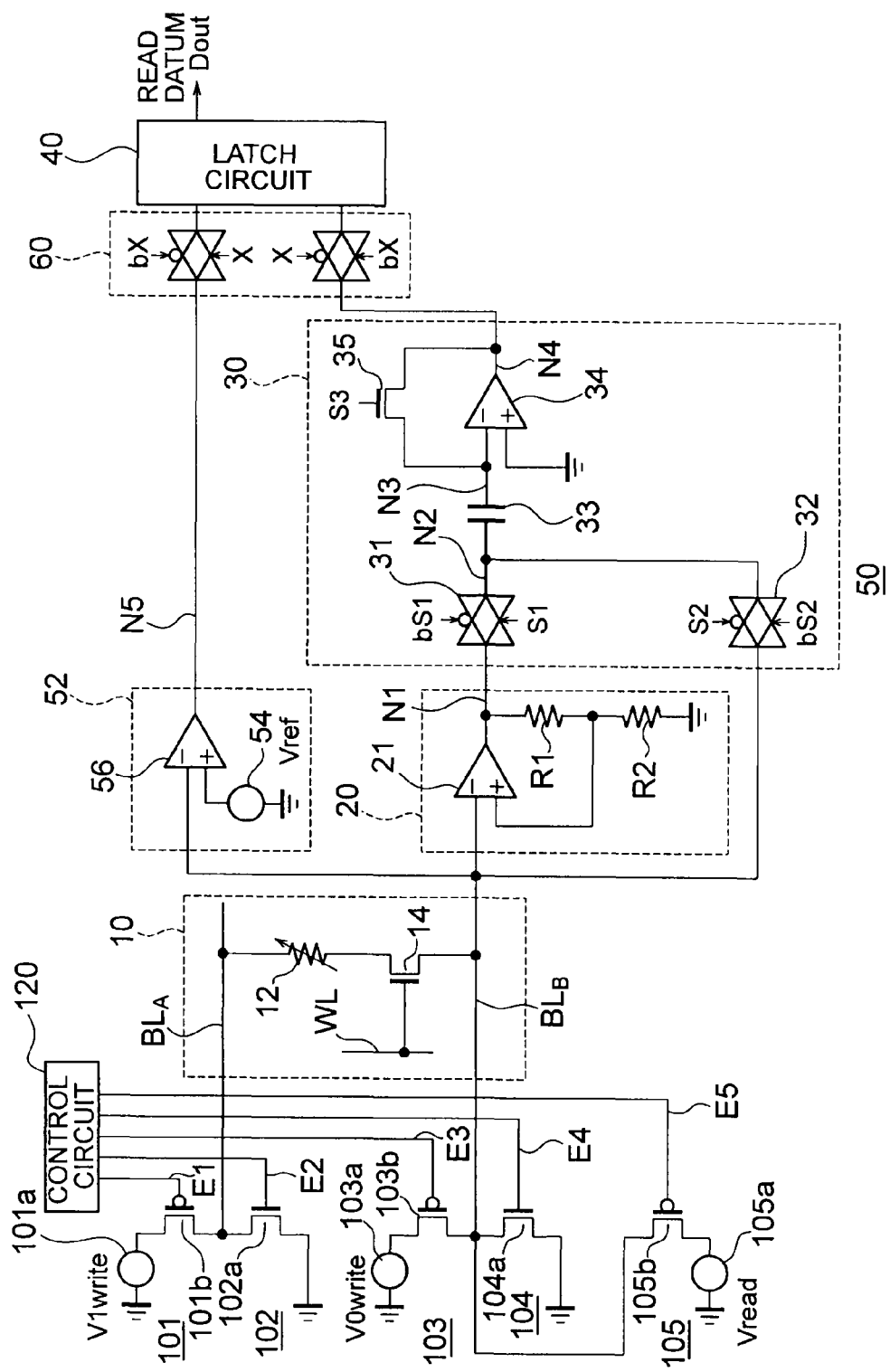
FIG. 10 is a circuit diagram showing a concrete example of the non-volatile semiconductor memory device according to the second embodiment.

A non-volatile semiconductor memory device according to a second embodiment of the present invention will now be described with reference to FIGS. 9 to 12. The non-volatile semiconductor memory device according to the present embodiment is an MRAM. Its schematic configuration is shown in FIG. 9, and its concrete configuration is shown in FIG. 10. The MRAM according to the present embodiment has a configuration obtained by newly providing a sense amplifier 52 and a select circuit 60 in the MRAM according to the first embodiment shown in FIG. 1 and FIG. 5. The sense amplifier 52 is provided in parallel with a first read circuit 50 formed of the amplifier circuit 20 and the comparator circuit 30. The sense amplifier 52 constitutes a second read circuit. As shown in FIG. 10, the sense amplifier 52 includes a power supply 54 which generates a reference voltage Vref and an operational amplifier 56. As for the reference voltage Vref, for example, a middle value between an average value of a value VrH in the case where the voltage Vr appearing on the bit line $BL_B$ when the read voltage Vread is selected is high (in the case where the memory element 12 is high in resistance) and an average value of a value VrL in the case where the voltage Vr appearing on the bit line $BL_B$ is low (in the case where the memory element 12 is low in resistance) is selected. An inverting input terminal of the operational amplifier 56 is connected to the bit line $BL_B$, a non-inverting input terminal of the operational amplifier 56 is connected to the power supply 54, and an output terminal of the operational amplifier 56 is connected to a node N5. In other words, the operational amplifier 56 compares the voltage on the bit line $BL_B$ with the reference voltage Vref, thereby makes a decision whether state read on the bit line $BL_B$ is "1" or "0," and sends a result to the select circuit 60 via the node N5. The select circuit 60 is, for example, a multiplexer. The select circuit 60 selects an output of either the first read circuit or the second read circuit according to a control signal X sent from the control circuit 120, and sends the selected output to the latch circuit 40.

Figure 11:
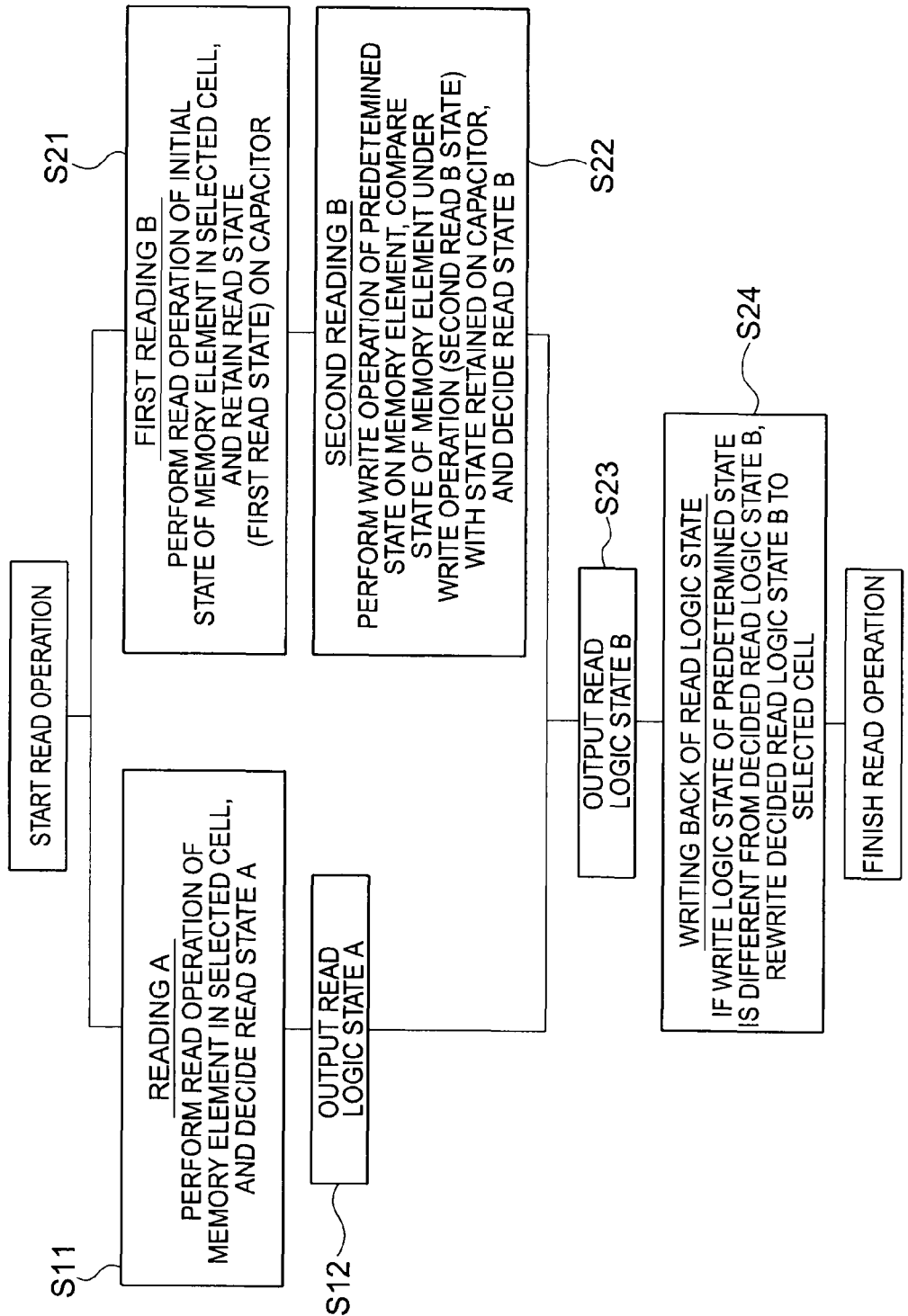
FIG. 11 is a flow chart for explaining a reading method for the non-volatile semiconductor memory device according to the second embodiment.
Figure 12:
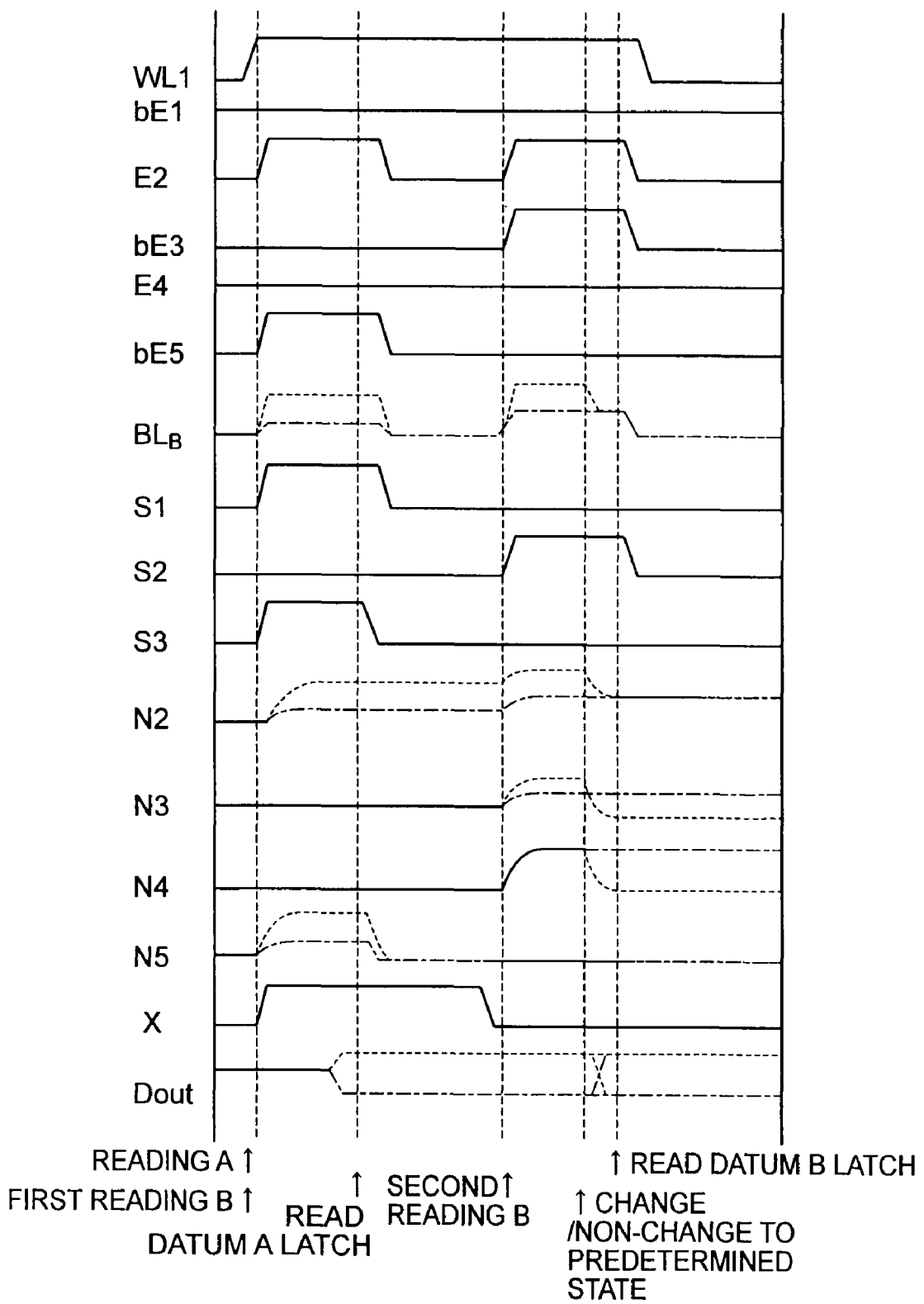
FIG. 12 is a timing chart for explaining the reading method for the non-volatile semiconductor memory device according to the second embodiment.

The read operation for the MRAM in the present embodiment will now be described with reference to FIG. 11 and FIG. 12. The reading method is formed of three stages.

1) First, as a first stage, state of the selected memory cell is read concurrently by using the first read circuit 50 and the second read circuit 52. In reading A performed by the second read circuit 52, a read operation is performed on the memory element 12 in the selected memory cell and the read state A is decided (see step S11). On the other hand, in first reading B performed by the first read circuit 50, the initial state of the memory element 12 in the selected memory cell 10 is read as first read B state and retained on the capacitor 33 in the comparator circuit 30 in the same way as the step S1 in the first embodiment (see step S21). In the first stage, the state A read out by the second read circuit 52 is output via the select circuit 60 and the latch circuit 40 (see step S12). In this case, the second read circuit 52 is selected by the select circuit 60 according to the control signal X, and the read state A is latched by the latch circuit 40 and output.

2) Subsequently, as a second stage, second reading B is performed (see step S22). In the second reading B, a write operation of a predetermined state is performed on the memory element 12 in the selected memory cell 10, state of the memory element 12 under the write operation is read, and the state thus read (second read B state) is compared with state stored on the capacitor 33 (first read B state) to decide the read state in the same way as the step S2 in the first embodiment (see step S22). In the second stage, the state read by the first read circuit 50 is output as the read state B via the select circuit 60 and the latch circuit 40 (see step S23). In this case, the first read circuit 50 is selected by the select circuit 60 on the basis of the control signal X and its inverted signal Xb, and the read state B is latched by the latch circuit 40 and output.

3) Finally, as a third stage, writing back of the read logic state is performed. The control circuit 120 makes a decision for the selected cell whether the write logic state of the predetermined state in the second stage and the read logic state B decided in the second stage are different from each other, in the same way as the step S3 in the first embodiment. If they are different from each other, the control circuit 120 rewrites the decided read logic state B (see step S24). If the voltage at the node N4 becomes the "L" level, a state "0" different from the initial state "1" has already been written. Therefore, the MOS transistor 101b and the MOS transistor 104a are turned on. And the write voltage of logic "1" V1write and GND are selected, and the logic "1" is rewritten into the memory element 12. A series of read operations are completed as heretofore described.

The second embodiment has a feature that the reading A and the reading B are started concurrently, the read state read out earlier is output earlier, and the logic state A is replaced by the read logic state B read out later. The reading A is a method of capable of reading at fast speed because of a short read step. However, there is a possibility that the read logic state will be erroneous because the read logic state is judged by using a common reference voltage in a plurality of cells. In the reading B, reading becomes low in speed because of a long read step. However, the possibility of including a read error is lower as compared with the reading A, resulting in higher reliability. Viewed from the viewpoint of memory users, therefore, the second embodiment is effective to use in which the data can be received early although an error might be included and then the data is replaced by highly reliable data. For example, the second embodiment is effective to use in which apparent reading is made high in speed because it is desired to know a general image of data even if errors are contained to some extent, as in reproduction of data of an image picked up by a digital camera.

According to the present embodiment as well, the read access time can be shortened in the same way as the first embodiment.

Third Embodiment

Figure 13:
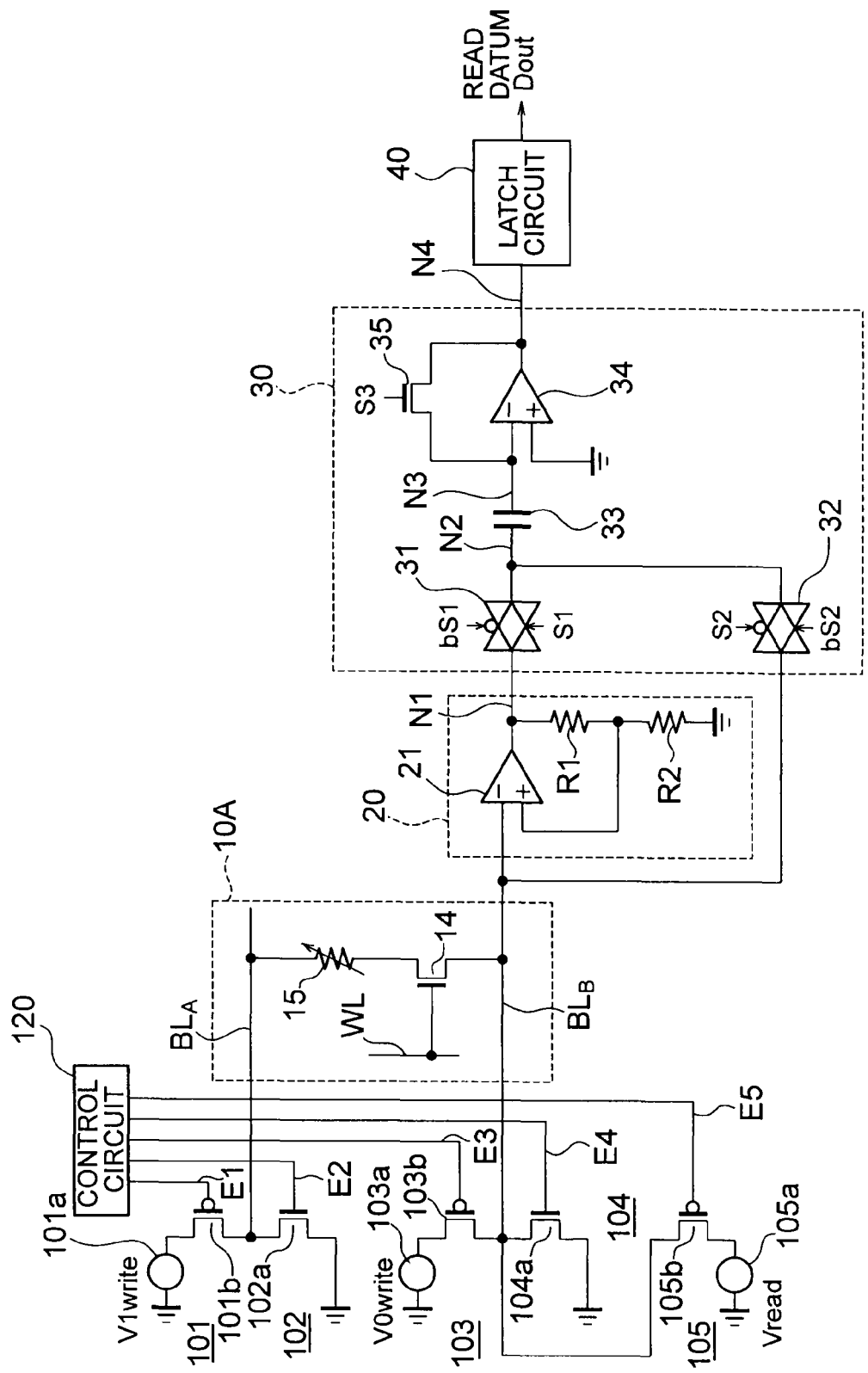
FIG. 13 is a circuit diagram showing a concrete example of the non-volatile semiconductor memory device according to a third embodiment.
Figure 14:
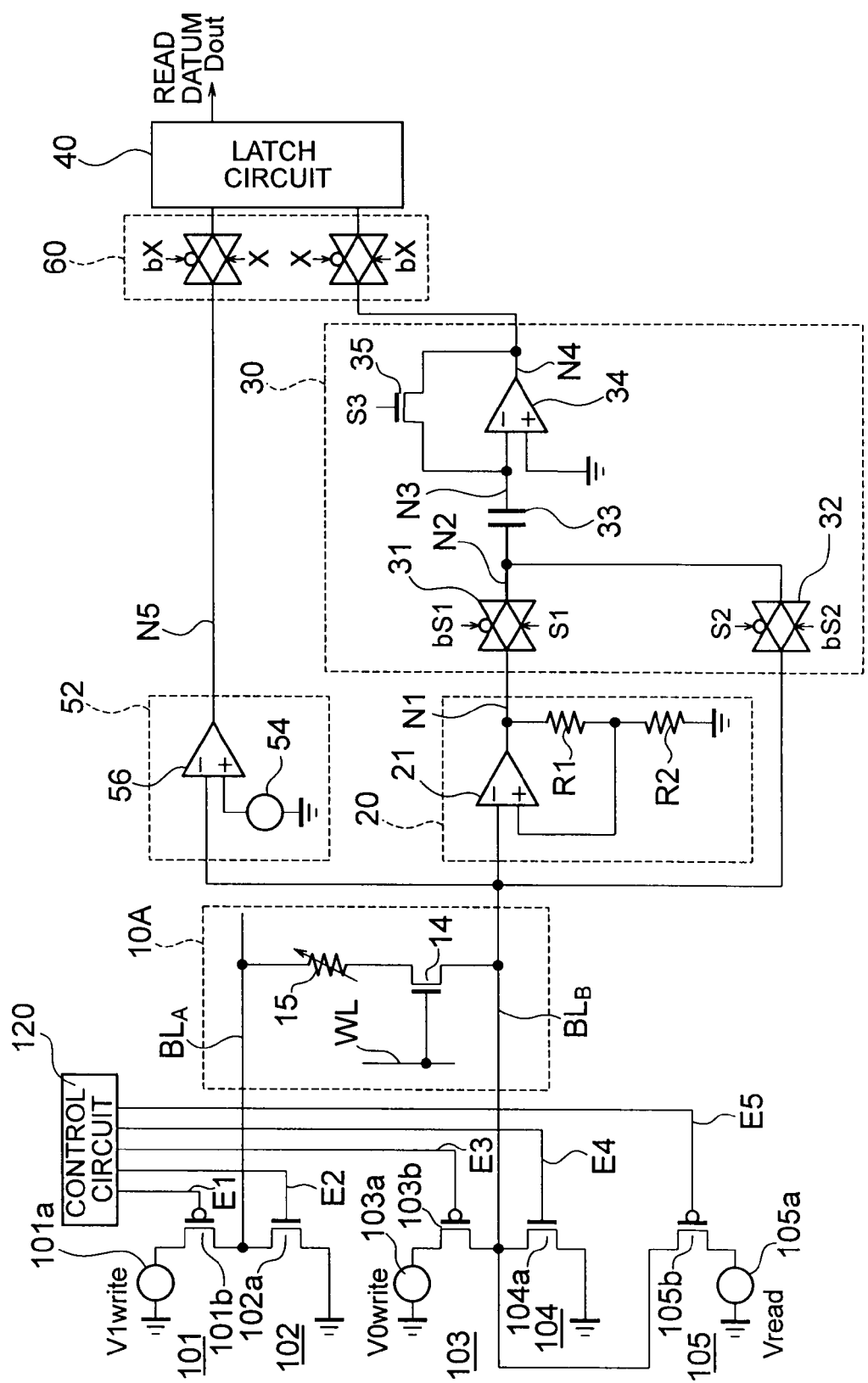
FIG. 14 is a circuit diagram showing a concrete example of the non-volatile semiconductor memory device according to a fourth embodiment.

A non-volatile semiconductor memory device according to a third embodiment of the present invention is shown in FIG. 13. The non-volatile semiconductor memory device according to the present embodiment has a configuration obtained by replacing the memory cell 10 in the MRAM according to the first embodiment shown in FIG. 5 with a memory cell 10A. The memory cell 10A has a configuration obtained by replacing the MTJ device 12 which is the memory element of the memory cell 10 with a resistance change type memory element 15 which is different from the MTJ device.

In recent years, development of two-terminal memory elements of resistance change type has been developed besides the MTJ device. In some resistance change type memory elements among them, the resistance value changes according to the condition under which an electric signal is given, in the same way as the MTJ device. Many of reported resistance change type memory elements are greater in resistance change ratio (here high resistance value/low resistance value) than MTJ device. When used as bi-value memory, the possibility that the distribution of the low resistance value and the distribution of the high resistance value overlap each other is low.

As described in a document "Y. Watanabe et. Al., Applied Physics Letters, vol. 78, no. 23 (2001)," however, resistance change type memory elements formed of $SrTiO_3$ with Cr doped have a resistance change ratio which is as small as approximately 1.5 with a high resistance value of approximately 6 kΩ and a low resistance value of approximately 4 kΩ, in some cases according to the condition of giving an electric signal. In that case, there is a possibility that the distribution of the low resistance value and the distribution of the high resistance value will overlap each other if the variation of the resistance value is large.

Thus, for performing reading from a memory cell including a resistance change type memory element having variation and a low resistance ratio, the self reference reading method becomes necessary. In such a case as well, the reading method described in the first embodiment can be applied. For example, in the case of a memory device requiring electric signals having different polarities for programming, the configuration shown in FIG. 13 is used. Operation is performed in the same way as that of the first embodiment.

According to the present embodiment as well, the read access time can be shortened in the same way as the first embodiment.

Fourth Embodiment

A non-volatile semiconductor memory device according to a fourth embodiment of the present invention is shown in FIG.

14. The non-volatile semiconductor memory device according to the present embodiment has a configuration obtained by replacing the memory cell 10 in the MRAM according to the second embodiment shown in FIG. 10 with a memory cell 10A. The memory cell 10A has a configuration obtained by replacing the MTJ device 12 which is the memory element of the memory cell 10 with a resistance change type memory element 15 which is different from the MTJ device.

According to the present embodiment as well, the read access time can be shortened in the same way as the third embodiment.

Fifth Embodiment

Figure 15:
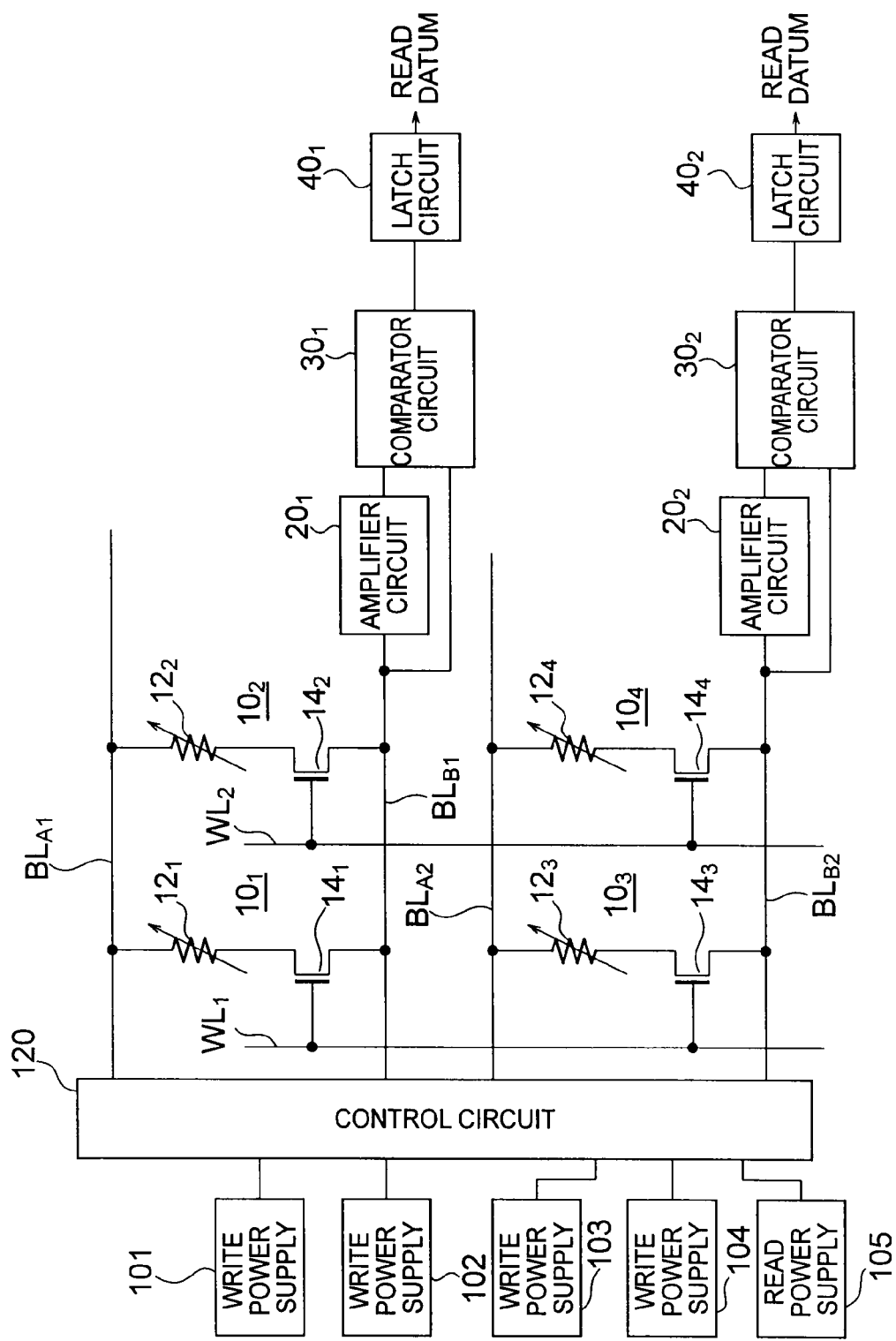
FIG. 15 is a circuit diagram showing a concrete example of the non-volatile semiconductor memory device according to a fifth embodiment.

A non-volatile semiconductor memory device according to a fifth embodiment of the present invention is shown in FIG. 15. The non-volatile semiconductor memory device according to the present embodiment has a configuration obtained by arranging memory cells in a matrix form in the MRAM according to the first embodiment. In other words, a plurality of memory cells $10_1$ to $10_4$ are arranged in a matrix form. Each memory cell $10_i$ (i=1, . . . , 4) includes a MTJ device $12_i$ and a selection transistor $14_i$ connected in series. Memory cells on the same row are connected to the same bit line pair. For example, memory cells $10_1$ and $10_2$ on the same row are connected to the same bit line pair $BL_{A1}$ and $BL_{B1}$, and memory cells $10_3$ and $10_4$ are connected to the same bit line pair $BL_{A2}$ and $BL_{B2}$. By the way, first ends of the MTJ devices $12_1$ and $12_2$ respectively in the memory cells $10_1$ and $10_2$ are connected to the bit line $BL_{A1}$, and first ends of the selection transistors $14_1$ and $14_2$ respectively in the memory cells $10_1$ and $10_2$ are connected to the bit line $BL_{B1}$. First ends of the MTJ devices $12_3$ and $12_4$ respectively in the memory cells $10_3$ and $10_4$ are connected to the bit line $BL_{A2}$, and first ends of the selection transistors $14_3$ and $14_4$ respectively in the memory cells $10_3$ and $10_4$ are connected to the bit line $BL_{B2}$.

Furthermore, memory cells on the same column are connected to the same word line. For example, gates of the selection transistors $14_1$ and $14_3$ respectively in the memory cells $10_1$ and $10_3$ are connected to the same word line $WL_1$, and gates of the selection transistors $14_2$ and $14_4$ respectively in the memory cells $10_2$ and $10_4$ are connected to the same word line $WL_2$.

An amplifier circuit $20_i$, a comparator circuit $30_i$ and a latch circuit $40_i$ are connected to each bit line $BL_{Bi}$ (i=1, 2) in the same way as the first embodiment. The amplifier circuit $20_i$, the comparator circuit $30_i$ and the latch circuit $40_i$ have the same configurations as those of the amplifier circuit 20, the comparator circuit 30 and the latch circuit 40 in the first embodiment, respectively. In other words, a read circuit including the amplifier circuit $20_i$, the comparator circuit $30_i$ and the latch circuit $40_i$ is shared by memory cells on the same row.

In the non-volatile semiconductor memory device according to the present embodiment as well, it becomes possible to apply the same read method as that of the first embodiment and the read access time can be shortened.

By the way, in the present embodiment, the MTJ device serving as a memory element in each memory cell may be replaced by an element different from the MTJ device such as, for example, the resistance change type memory element described in the third embodiment.

Sixth Embodiment

Figure 16:
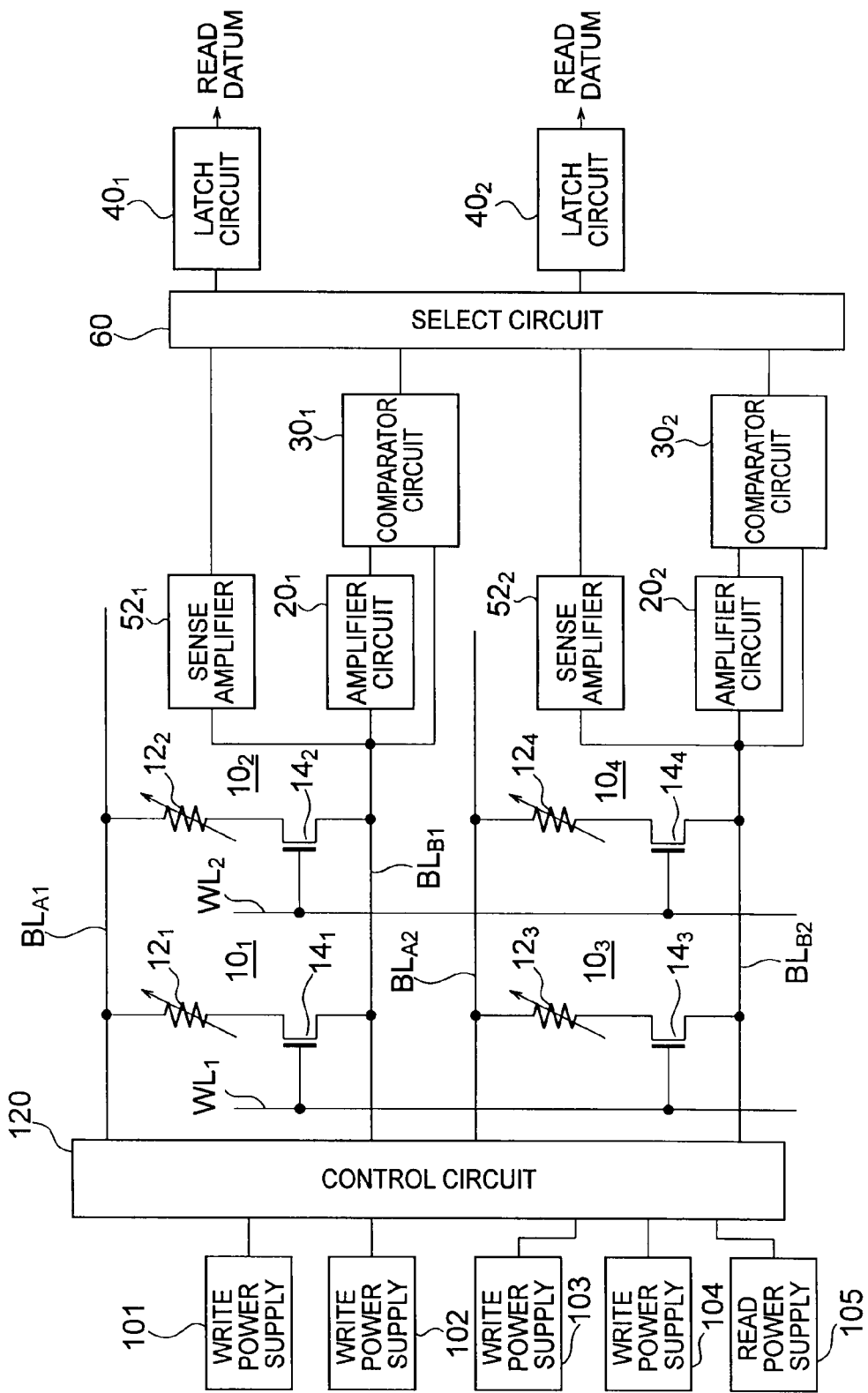
FIG. 16 is a circuit diagram showing a concrete example of the non-volatile semiconductor memory device according to a sixth embodiment.

A non-volatile semiconductor memory device according to a sixth embodiment of the present invention is shown in FIG. 16. The non-volatile semiconductor memory device according to the present embodiment has a configuration obtained by arranging memory cells in a matrix form in the MRAM according to the second embodiment. In other words, a plurality of memory cells $10_1$ to $10_4$ are arranged in a matrix form. Each memory cell $10_i$ (i=1, . . . , 4) includes a MTJ device $12_i$ and a selection transistor $14_i$ connected in series. Memory cells on the same row are connected to the same bit line pair. For example, memory cells $10_1$ and $10_2$ on the same row are connected to the same bit line pair $BL_{A1}$ and $BL_{B1}$, and memory cells $10_3$ and $10_4$ are connected to the same bit line pair $BL_{A2}$ and $BL_{B2}$. By the way, first ends of the MTJ devices $12_1$ and $12_2$ respectively in the memory cells $10_1$ and $10_2$ are connected to the bit line $BL_{A1}$, and first ends of the selection transistors $14_1$ and $14_2$ respectively in the memory cells $10_1$ and $10_2$ are connected to the bit line $BL_{B1}$. First ends of the MTJ devices $12_3$ and $12_4$ respectively in the memory cells $10_3$ and $10_4$ are connected to the bit line $BL_{A2}$, and first ends of the selection transistors $14_3$ and $14_4$ respectively in the memory cells $10_3$ and $10_4$ are connected to the bit line $BL_{B2}$.

Furthermore, memory cells on the same column are connected to the same word line. For example, gates of the selection transistors $14_1$ and $14_3$ respectively in the memory cells $10_1$ and $10_3$ are connected to the same word line $WL_1$, and gates of the selection transistors $14_2$ and $14_4$ respectively in the memory cells $10_2$ and $10_4$ are connected to the same word line $WL_2$.

A first read circuit including an amplifier circuit $20_i$, a comparator circuit $30_i$ and a latch circuit $40_i$ and a second read circuit $52_i$ including a sense amplifier are connected to each bit line $BL_{Bi}$ (i=1, 2) in the same way as the second embodiment. The amplifier circuit $20_i$, the comparator circuit $30_i$, the latch circuit $40_i$ and the sense amplifier $52_i$ have the same configurations as those of the amplifier circuit 20, the comparator circuit 30, the latch circuit 40 and the sense amplifier 52 in the second embodiment, respectively. In other words, a first read circuit including the amplifier circuit $20_i$, the comparator circuit $30_i$ and the latch circuit $40_i$ and the second read circuit formed of the sense amplifier are shared by memory cells on the same row.

In the non-volatile semiconductor memory device according to the present embodiment as well, it becomes possible to apply the same read method as that of the second embodiment and the read access time can be shortened.

Viewed from the viewpoint of memory users, the present embodiment is effective to use in which a data can be received early although an error might be included and then the data is replaced by highly reliable data, in the same way as the second embodiment. For example, the present embodiment is effective to use in which apparent reading is made high in speed because it is desired to know a general image of data even if errors are contained to some extent, as in reproduction of data of an image picked up by a digital camera.

By the way, in the present embodiment, the MTJ device serving as a memory element in each memory cell may be replaced by an element different from the MTJ device such as, for example, the resistance change type memory element described in the third embodiment.

Figure 17:
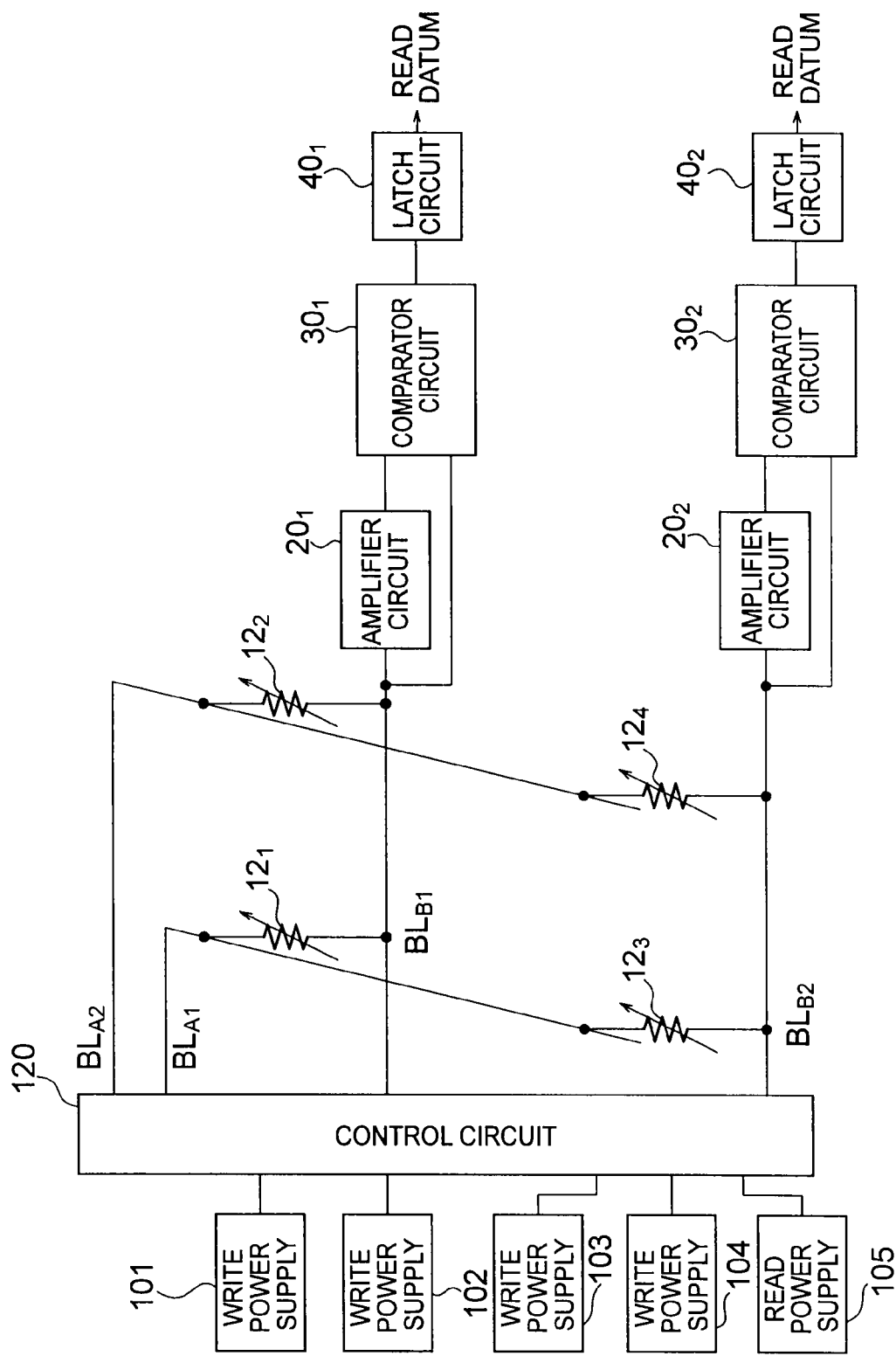
FIG. 17 is a circuit diagram showing a concrete example of a crosspoint type non-volatile semiconductor memory device according to an embodiment of the present invention.
Figure 18:
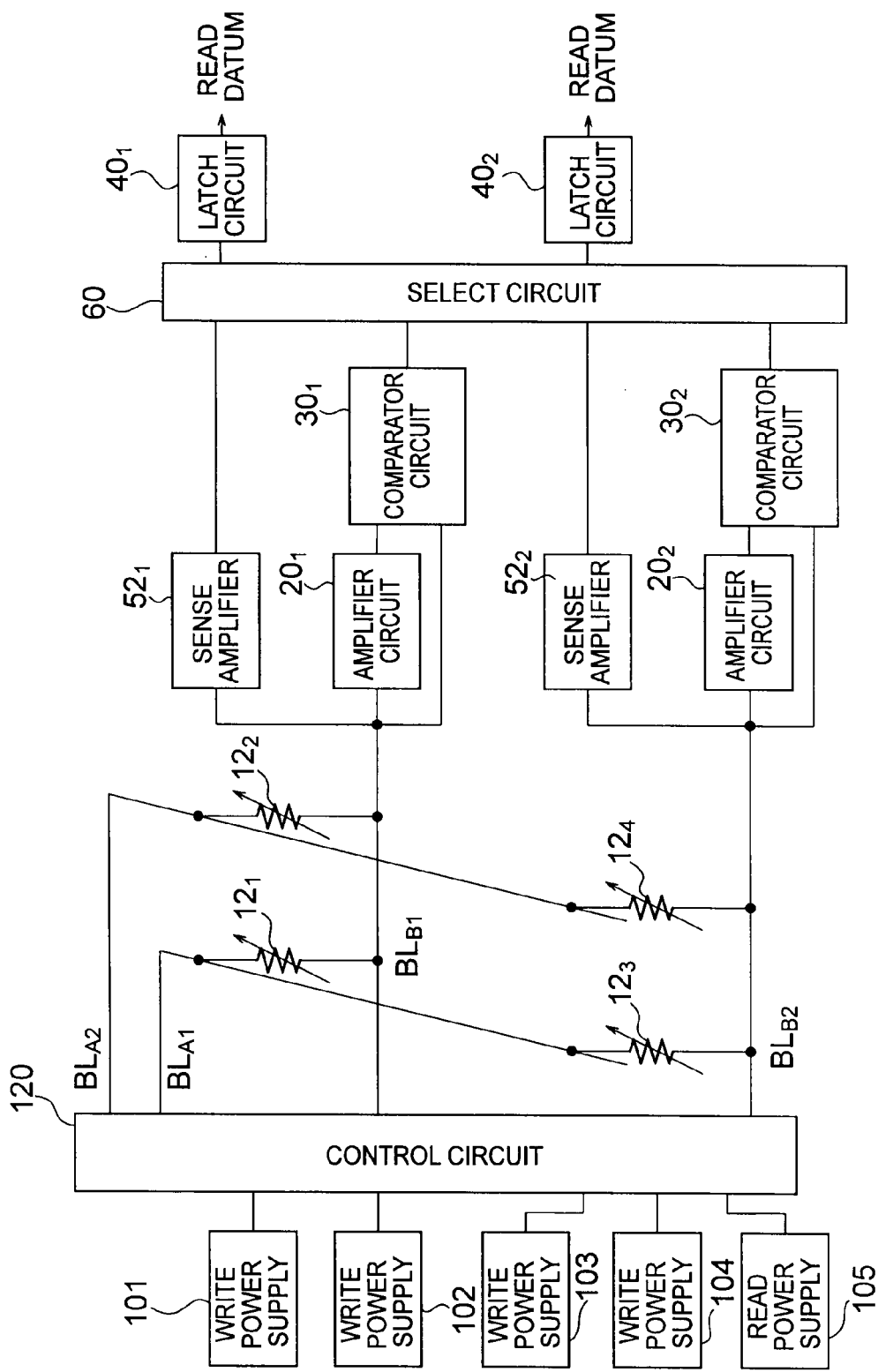
FIG. 18 is a circuit diagram showing another concrete example of the crosspoint type non-volatile semiconductor memory device according to the embodiment of the present invention.

In the first to sixth embodiments, a selection transistor is provided in each memory cell. Alternatively, crosspoint type memory cells having no selection transistors may be used. In that case, the bit lines $BL_{A1}$, and $BL_{A2}$ respectively play roles of the word lines $WL_1$ and $WL_2$ as well as shown in FIG. 17 for the fifth embodiment and FIG. 18 for the sixth embodiment. In each memory cell, a diode may be connected in series with the MTJ device.

According to respective embodiments of the present invention, the read access time can be made as short as possible, as heretofore described.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concepts as defined by the appended claims and their equivalents.

What is claimed is:

1. A non-volatile semiconductor memory device comprising:
   at least one memory cell each having a non-volatile memory element;
   a first line to which a first end of the memory element is connected;
   a second line to which a second end of the memory element is connected;
   a first write circuit which includes a first transistor, the first transistor supplying a first write voltage to the first line;
   a second write circuit which includes a second transistor, the second transistor supplying a second write voltage to the second line;
   a third write circuit which includes a third transistor and which is controlled so as to be paired with the first write circuit in a first write operation, the third transistor supplying a third write voltage to the second line;
   a fourth write circuit which includes a fourth transistor and which is controlled so as to be paired with the second write circuit in a second write operation, the fourth transistor supplying a fourth write voltage to the first line;
   a first read circuit which includes a fifth transistor and which is controlled so as to be paired with the fourth write circuit in a read operation, the fifth transistor supplying a read voltage to the second line;
   an amplifier circuit which amplifies a first voltage read out from the memory element onto the second line by the read operation for supplying the read voltage to the second line by the fifth transistor and outputs a second voltage obtained by amplifying the first voltage;
   a comparator circuit which includes a retaining part to retain the second voltage, and which compares a third voltage appearing on the second line during the second write operation with the second voltage retained by the retaining part; and
   a read logic state output circuit which outputs a logic state corresponding to a state stored in the memory element before the read operation, as a read logic state on the basis of a result of the comparison performed by the comparator circuit.

2. The device according to claim 1, wherein
   the amplifier circuit is a differential amplifier which amplifies a voltage on the second line with an amplification factor of n,
   VrH represents a higher voltage of the first voltage,
   VrL represents a lower voltage of the first voltage,
   VwL represents a lower voltage of the third voltage, and
   the amplification factor n satisfies the following relationship $VwL/VrH < n < VwL/VrL.$ 3. The device according to claim 1, wherein
   a plurality of the memory cells are arranged in a matrix form, and the first and second lines, the amplifier circuit, the comparator circuit and the read logic state output circuit are provided in common to the memory cells on the same row.

4. The device according to claim 1, further comprising:
   a transistor provided between the first end of the memory element and the first line or between the second end of the memory element and the second line; and
   a word line connected to a gate of the transistor.

5. The device according to claim 1, further comprising a second read circuit which reads concurrently with the first read circuit and outputs a logic state earlier than the output of the read logic state output circuit in the read operation.

6. The device according to claim 1, wherein the memory element is an MTJ element of spin injection type.

7. The device according to claim 1, wherein the memory element is a resistance change type memory element.

8. A reading method for a non-volatile semiconductor memory device, the non-volatile semiconductor memory device including: at least one memory cell each having a non-volatile memory element; a first line to which a first end of the memory element is connected; a second line to which a second end of the memory element is connected; a first write circuit which includes a first transistor, the first transistor supplying a first write voltage to the first line; a second write circuit which includes a second transistor, the second transistor supplying a second write voltage to the second line; a third write circuit which includes a third transistor and which is controlled so as to be paired with the first write circuit in a first write operation, the third transistor supplying a third write voltage to the second line; a fourth write circuit which includes a fourth transistor and which is controlled so as to be paired with the second write circuit in a second write operation, the fourth transistor supplying a fourth write voltage to the first line; and a read circuit which includes a fifth transistor and which is controlled so as to be paired with the fourth write circuit in a read operation, the fifth transistor supplying a read voltage to the second line, the method comprising:
   selecting the memory cell;
   performing the read operation on the selected memory cell to supply the read voltage to the second line by the fifth transistor, amplifying a first voltage read out from the selected memory element onto the second line, outputting a second voltage obtained by amplifying the first voltage, and storing the second voltage as a first read state of the memory element;
   thereafter performing the second write operation on the selected memory cell, regarding a third voltage appearing on the second line during the second write operation as a second read state of the memory element, comparing the first read state with the second read state, and deciding a state stored in the memory element before the read operation, as a read logic state on the basis of a result of the comparison; and
   writing the decided read logic state into the memory element if a logic state written in the second write operation is different from the decided read logic state.

9. The method according to claim 8, further comprising outputting the first read state to external as a read logic state.

10. The method according to claim 8, wherein the memory element is an MTJ element of spin injection type.

11. The method according to claim 8, wherein the memory element is a resistance change type memory element.

* * * * *